United States Patent
Van de Plassche et al.

(10) Patent No.: US 6,255,971 B1
(45) Date of Patent: *Jul. 3, 2001

(54) ANALOG-TO-DIGITAL CONVERSION ARRANGEMENT USING INPUT INTERCHANGING AND POST-PROCESSING TO PROVIDE BETTER LINEARITY

(75) Inventors: Rudy J. Van de Plassche; Arnoldus G. W. Venes, both of Eindhoven (NL)

(73) Assignee: U.S. Philips Corporation, New York, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/977,952

(22) Filed: Nov. 25, 1997

(30) Foreign Application Priority Data

Nov. 29, 1996 (EP) .................................................. 96203374

(51) Int. Cl.[7] .............................. H03M 1/10; H03M 1/06
(52) U.S. Cl. ........................................... 341/120; 341/118
(58) Field of Search ..................................... 341/155, 156, 341/120, 121, 162, 172, 168, 118, 184; 340/870.04

(56) References Cited

U.S. PATENT DOCUMENTS

| | | | |
|---|---|---|---|
| 3,585,634 | * 6/1971 | Sharples | 341/172 |
| 4,831,379 | 5/1989 | Van de Plassche | 341/156 |
| 4,857,933 | * 8/1989 | Knight | 341/168 |
| 4,975,700 | * 12/1990 | Tan et al. | 341/118 |
| 5,101,206 | * 3/1992 | Riedel | 341/156 |
| 5,194,866 | * 3/1993 | Imaizumi et al. | 341/156 |
| 5,200,752 | * 4/1993 | Goeke | 341/168 |
| 5,298,801 | 3/1994 | Vorenkamp et al. | 307/353 |
| 5,321,403 | * 6/1994 | Eng, Jr. et al. | 341/168 |
| 5,416,484 | * 5/1995 | Lofstrom | 341/159 |
| 5,565,869 | * 10/1996 | Brodie et al. | 341/168 |
| 5,594,445 | * 1/1997 | Ginetti | 341/162 |
| 5,805,091 | * 9/1998 | Sherry et al. | 341/120 |
| 5,861,828 | * 1/1999 | Opris | 341/120 |

OTHER PUBLICATIONS

PHN 15,450, U.S. Patent Application Serial No. 08/704,198, filed Aug. 28, 1996.

PHN 15,909, U.S. Patent Application Serial No. 08/709,401, filed Sep. 4, 1996.

* cited by examiner

Primary Examiner—Patrick Wamsley

(57) ABSTRACT

In an A/D conversion, digital codes (DC) are obtained on the basis of respective comparisons (A) between an input signal (IN) and at least one reference level (REF). In order to improve the A/D conversion characteristics, the input signal (IN) and the respective reference level (REF) are interchanged (SW) in respect of at least one comparison (A). The digital codes (DC) are processed (POPR) so as to obtain digital output codes (DOC) whose respective signs and magnitudes are, at least on average, substantially independent of any interchanges.

9 Claims, 6 Drawing Sheets

POPR

ANALOG-TO-DIGITAL CONVERSION ARRANGEMENT USING INPUT INTERCHANGING AND POST-PROCESSING TO PROVIDE BETTER LINEARITY

BACKGROUND OF THE INVENTION

The invention relates to an analog-to-digital (A/D) conversion arrangement and a method in which digital codes are obtained on the basis of respective comparisons between an input signal and at least one reference level. The invention also relates to a signal processing device incorporating such an A/D conversion arrangement.

U.S. Pat. No. 4,831,379 describes a prior-art A/D converter. The prior-art A/D converter comprises an array of 64 input amplifiers. Assuming that i is an integer ranging from 0 to 63, each amplifier Ai amplifies the difference between an analog input voltage and a corresponding reference voltage VRi to produce an amplified output voltage VAi. The amplified output voltages VA0–VA63 are processed in a folding array and an interpolation circuit to produce complementary signals VD0/VDN0 . . . VD31/VDN31, from which signals an output circuit derives a digital output code.

SUMMARY OF THE INVENTION

It is an object of the invention to provide a type of A/D conversion which, with respect to the background art, allows a better A/D conversion characteristic.

The invention takes the following aspects into consideration. An A/D conversion characteristic is substantially determined by one or more reference levels with which an input signal is effectively compared. In practice, the reference levels with which the input signal is effectively compared deviate to a greater or lesser extent from nominal reference levels with which an optimal A/D conversion characteristic would be obtained if there were no such deviation. The reason for this deviation is that components which, in combination, carry out the A/D conversion suffer from tolerances, temperature dependency, and the like. This not only applies to reference level components which, in combination, provide the reference levels with which the input signal is compared, but it also applies to conversion components which, in combination, carry out the comparison and additional operations in order to obtain a digital code.

In accordance with the invention, the input signal and the respective reference level are interchanged in respect of at least one comparison. If the conversion components were ideal, digital codes obtained before and after an interchange would only differ in sign but not in magnitude, for a certain input signal level. However, since the conversion components suffer from tolerances, temperature dependency, and the like, the digital codes will differ in magnitude as a result of the interchange. In accordance with the invention, the digital codes are processed to obtain digital output codes whose respective signs and magnitudes are, at least on average, substantially independent of any interchanges. This substantially reduces the adverse effects that tolerances, temperature dependency, and the like may have on the A/D conversion characteristic. As an example, in an A/D conversion based on a plurality of reference levels which are nominally equidistant, the invention allows a substantially better linearity than the background art.

Other advantages of the invention are as follows. A satisfactory A/D conversion characteristic can be obtained with components which, with respect to the background art, need to meet less stringent requirements in terms of tolerances, temperature dependency, and the like. Consequently, the invention also allows more cost-efficient implementations than the background art, for example, implementations with MOS transistors only. Another consequence is that, if the A/D conversion is implemented as an integrated circuit, smaller components can be used than in the background art. Smaller components have smaller parasitic capacitances, which is beneficial to the high-frequency properties of the A/D conversion. Furthermore, smaller components leave more room for other circuitry than A/D conversion circuitry. Thus, the invention is particularly suitable for combining A/D conversion and digital signal processing in a single signal processing device, for example in the form of an integrated circuit.

The invention and additional features, which may optionally be used to implement the invention to advantage, are apparent from and will be elucidated with reference to the drawings described hereinafter.

BRIEF DESCRIPTION OF THE DRAWINGS

In the drawings.

Like elements are denoted by like reference signs throughout the drawings.

DETAILED DESCRIPTION OF THE DRAWINGS

Figure 1:
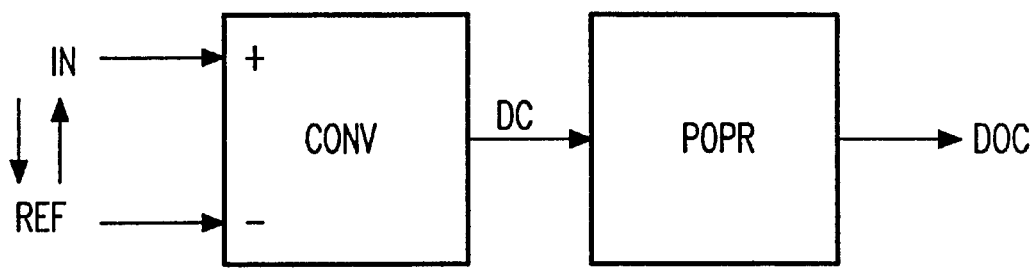
FIG. 1 illustrates, in a conceptual diagram form, the basic principles of the invention.

FIG. 1 illustrates the basic principles of the invention. A conversion circuit CONV provides digital codes DC on the basis of respective comparisons between an input signal IN and at least one reference level REF. The input signal IN and the respective reference level REF are interchanged in respect of at least one comparison. FIG. 1 illustrates this by means of a pair of arrows with opposite directions and a plus (+) input + and minus (−) input − of the conversion circuit to which the signals may be applied. A post-processing circuit POPR processes the digital codes DC so as to obtain digital output codes DOC whose respective signs and magnitudes are, at least on average, substantially independent of any interchanges.

There are various manners in which the desired digital output codes DOC may be obtained. Three manners will be discussed below with reference to FIGS. 2a, 2b, 3a, 3b, 3c, 4a, and 4b.

Figure 2A:
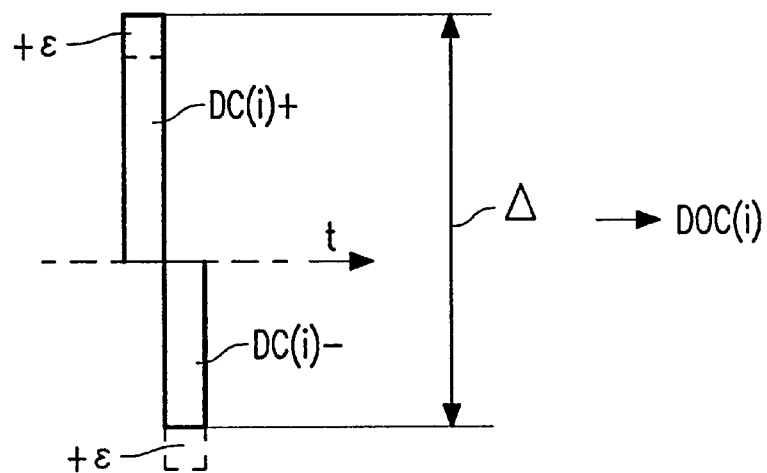
FIGS. 2a illustrates, in a conceptual diagram form, a first manner of obtaining digital output codes.

FIG. 2a illustrates a first manner of obtaining the desired digital output codes DOC. A digital output code DOC(i) is provided as a function of the difference Δ between a digital code DC(i)+ before an interchange and a digital code DC(i)− after an interchange. Any tolerances, temperature dependency, and the like, of the components which form part of the conversion circuit CONV, hereinafter referred to as conversion component non-idealities, will affect the digital codes DC(i)+ and DC(i)− to substantially the same extent. In FIG. 2a, the digital code DC(i)+ and the digital code DC(i)− have, for example, a magnitude error +ε which is due to conversion component non-idealities. The difference between these digital codes DC(i)+ and DC(i)− is, however, independent of this magnitude error +ε and, consequently, only depends on the input signal IN with respect to the respective reference level REF. Thus, the FIG. 2a manner allows the A/D conversion characteristic to be substantially insensitive to conversion component non-idealities.

Figure 2B:
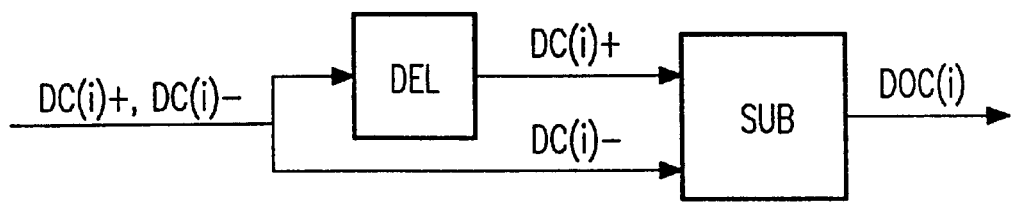
FIGS. 2b shows, in a block diagram form, an example of a post-processing circuit which provides digital codes in the FIG. 2a manner.

FIG. 2b shows an example of a post-processing circuit which provides an output code DOC in the FIG. 2a manner. The FIG. 2b post-processing circuit comprises a delay circuit DEL and a subtraction circuit SUB. The delay circuit DEL delays the digital code DC(i)+ received from the conversion circuit CONV. The subtracter SUB subtracts the code DC(i)− from the code DC(i)+ which it receives from the delay circuit DEL, or vice versa. In addition, the subtracter SUB may optionally scale the difference A thus obtained between the digital codes DC(i)+ and DC(i)−, so as to obtain the digital output code DOC(i).

Figure 3A:
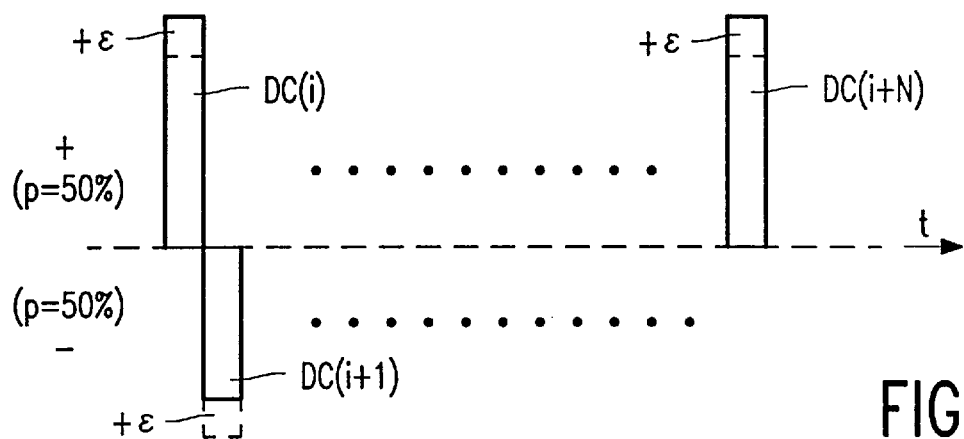
FIGS. 3a and 3b together illustrate, in a conceptual diagram form, a second manner of obtaining digital output codes.
Figure 3B:
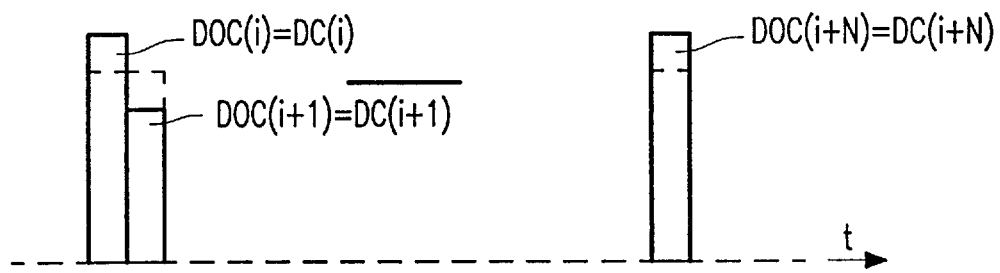

FIGS. 3a and 3b, in combination, illustrate a second manner of obtaining the desired digital output codes DOC. FIG. 3a shows a series of digital codes DC(i),DC(i+1) . . . DC(i+N) which are obtained when the interchanging of the input signal IN and the respective reference level REF is carried out in a random manner. As a result, there is a fifty percent chance (p=50%) for each of the digital codes that the digital code has a positive sign, and there is a fifty percent chance (p=50%) that the digital code has a negative sign. In FIG. 3a, positive-sign digital codes are represented on the + side of the time axis t, whereas negative digital codes are represented on the −side. All digital codes DC(i),DC(i+1) . . . DC(i+N) have a magnitude error +ε which is due to conversion component non-idealities.

FIG. 3b shows digital output codes DOC(i),DOC(i+1) . . . DOC(i+N) which are obtained by inverting or not inverting the digital codes DC(i), DC(i+1), . . . DC(i+N) in accordance with the interchanging, which is carried out in a random manner. As a result, the magnitude error +ε is effectively translated to white noise, because the sign of the magnitude error in the digital output codes DOC(i),DOC(i+1) . . . DOC(i+N) varies at random. In the FIGS. 3a–3b manner, only one digital code is needed to establish a digital output code, whereas in the FIG. 2a manner, two digital codes are needed to establish a digital output code. Thus, the FIGS. 3a–3b manner allows a higher conversion rate than the FIG. 2a manner.

Figure 3C:
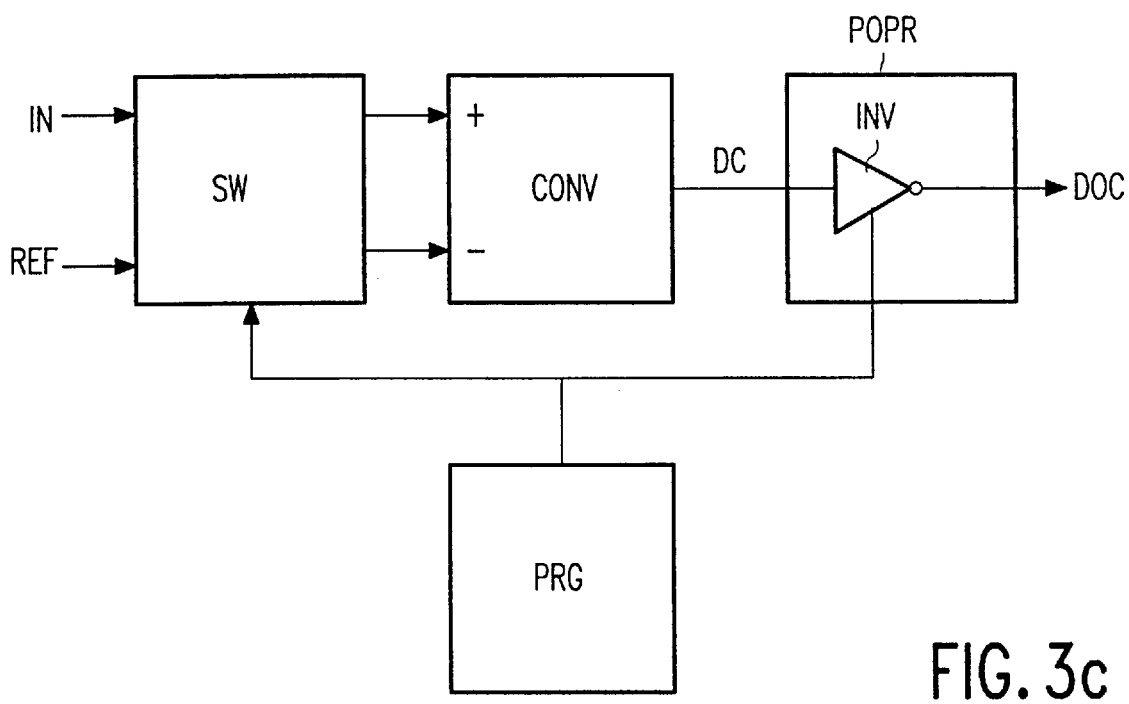
FIGS. 3c shows, in a block diagram form, an example of a post-processing circuit which provides digital codes in the FIGS. 3a–3b manner.

FIG. 3c shows an example of an A/D conversion arrangement which provides digital output codes DOC in the FIGS. 3a–3b manner. The FIG. 3c A/D conversion arrangement comprises a switching circuit SW which is coupled to a pseudo-random generator circuit PRG for interchanging the input signal IN and the respective reference level REF in a random manner. The post-processing circuit POPR comprises a controllable inverter INV. The controllable inverter INV is also coupled to the pseudo-random generator circuit PRG for inverting or not inverting the digital codes DC in accordance with the interchanging.

Figure 4A:
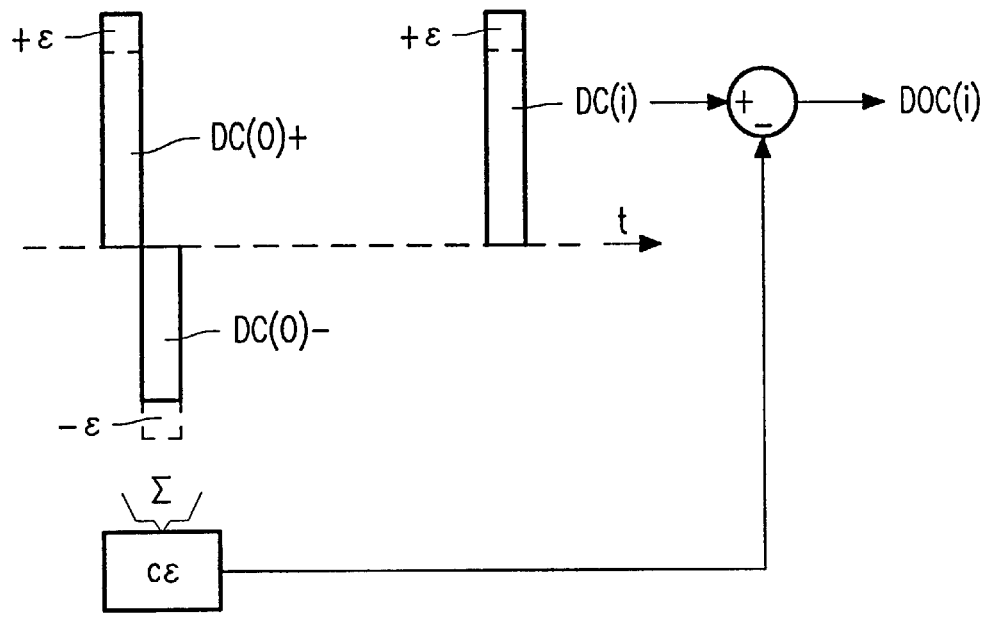
FIGS. 4a illustrates, in a conceptual diagram form, a third manner of obtaining digital output codes.

FIG. 4a illustrates a third manner of obtaining the desired digital output codes DOC. In FIG. 4a, digital codes DC(0)+ and DC(0)− have been obtained before and after an interchange, respectively. Both digital codes have a magnitude error +ε which is due to conversion component non-idealities. The sum Σ of the digital codes DC(0)+ and DC(0)− is substantially equal to 2ε. An error code cε is derived from this sum Σ, stored, and later used to correct a further digital code DC(i) so as to obtain a digital output code DOC(i). Thus, the FIG. 4a manner allows substantial elimination of the magnitude error +ε for each digital output code, which was also the case in the FIG. 2a manner. Moreover, the FIG. 4a manner allows a higher conversion rate than the FIG. 2a manner.

Figure 4B:
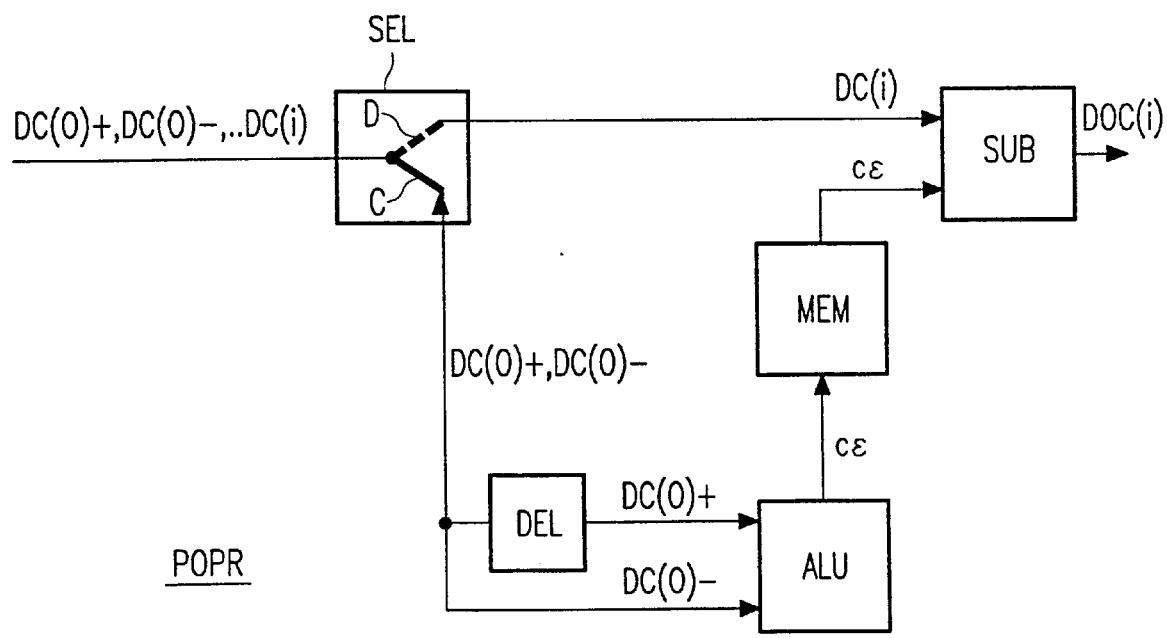
FIGS. 4b shows, in a block diagram form, an example of a post-processing circuit which provides digital codes in the FIG. 4a manner.

FIG. 4b shows an example of a post-processing circuit POPR which provides digital output codes DOC in the FIG. 4a manner. It comprises a selector SEL, a delay circuit DEL, an arithmetic circuit ALU, a memory MEM and a subtraction circuit SUB. The FIG. 4b post-processing circuit POPR may operate in a calibration mode and in a conversion mode. In the calibration mode, the selector SEL is in position C and the digital codes DC(0)+ and DC(0)− are supplied to the arithmetic circuit ALU, whereby the delay circuit DEL delays the digital code DC(0)+. The arithmetic circuit ALU calculates the correction code cε which is stored in memory MEM. In the conversion mode, the selector SEL is in position D and supplies the digital code DC(i) to the subtracter SUB. The memory MEM supplies the error code cc to the subtracter SUB which subtracts the error code cε from the digital code DC(i). As a result, the digital output code DOC(i) is obtained.

The following is noted with respect to the FIG. 4a manner of obtaining the digital output codes DOC. In practice, the magnitude error +ε, which is illustrated in FIG. 4a, may vary as a function of the magnitude of the input signal IN, in particular if a plurality of reference levels REF is used. In that case, it may be advantageous to determine and, subsequently, store a plurality of error codes cε(1), cε(2), . . . cε(K) for various respective magnitudes. To correct a certain digital code, an error code is selected from the plurality of error codes cε(1), cε(2), . . . cε(K) on the basis of best magnitude match. Optionally, two or more error codes may be selected to make an interpolation between these error codes. The interpolated error code thus obtained is then used to correct the relevant digital code. The advantage of such an interpolation is that relatively little memory capacity is needed for a sufficiently accurate correction.

Figure 5:
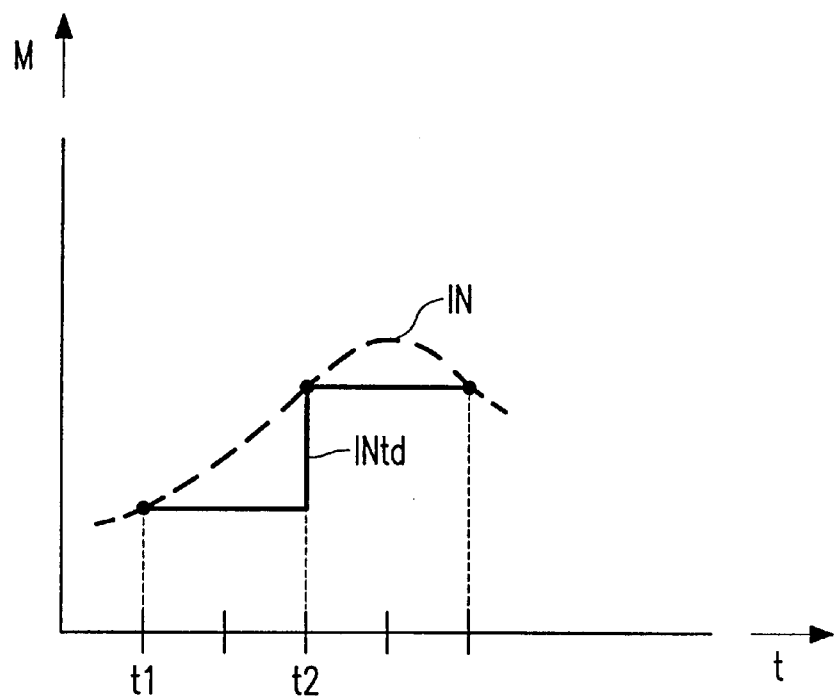
FIG. 5 illustrates, in a signal diagram form, a sample-and-hold operation which may optionally be used to implement the invention to advantage.

An option to implement the invention to advantage is the use of a sample-and-hold circuit to apply the input signal IN to the conversion circuit CONV in a time-discrete manner. An advantage of this option will be explained with reference to FIG. 5. FIG. 5 is a signal graph having a horizontal axis representing time (t) and a vertical axis representing magnitude (M). It shows, in broken lines, an input signal IN and, in solid lines, a time-discrete version INtd of the input signal, which is obtained by means of the sample-and-hold circuit not shown.

If the FIG. 5 input signal IN is supplied to the conversion circuit CONV, and an interchange with the respective reference level REF occurs between t1 and t2, for example, digital codes obtained before and after the interchange will differ in magnitude. The magnitude difference will not only be due to conversion component non-idealities, but also to the variation of the input signal IN itself. This may reduce the extent to which the post-processing circuit PROP is capable of countering adverse effects of conversion component non-idealities. If, however, the time-discrete version INtd of the input signal is applied to the conversion circuit CONV, such a reduction in performance will not occur.

Figure 6:
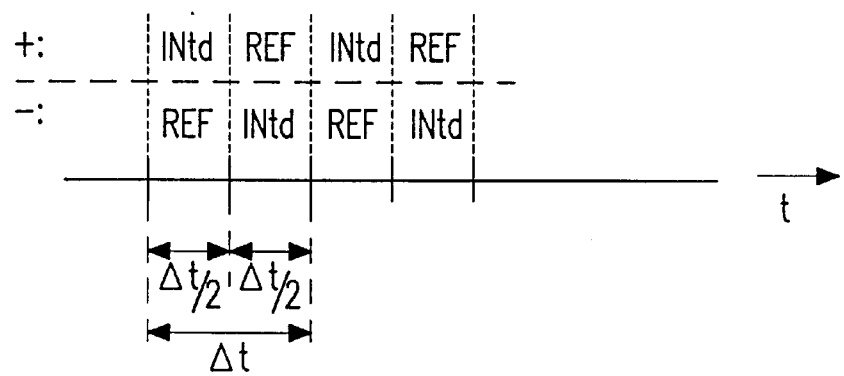
FIG. 6 illustrates, in a conceptual diagram form, a manner of interchanging which may optionally be used to implement the invention to advantage.

A further option to implement the invention to advantage, in addition to the option described above, is to carry out the interchanging at twice the sample rate of the time-discrete version INtd of the input signal. This option is illustrated in FIG. 6 in conjunction with FIG. 5. FIG. 6 has a time axis t which corresponds to that in FIG. 5. A sample period $\Delta t$ is the difference between t1 and t2. Accordingly, the sample rate is $1/\Delta t$. FIG. 6 illustrates the interchanging by means of a + row and a − row, in which rows the levels to be compared, namely INtd and REF, may be placed. After time intervals of $\Delta t/2$, the signals mutually change positions in the two rows, that is, they are interchanged.

Figure 7:
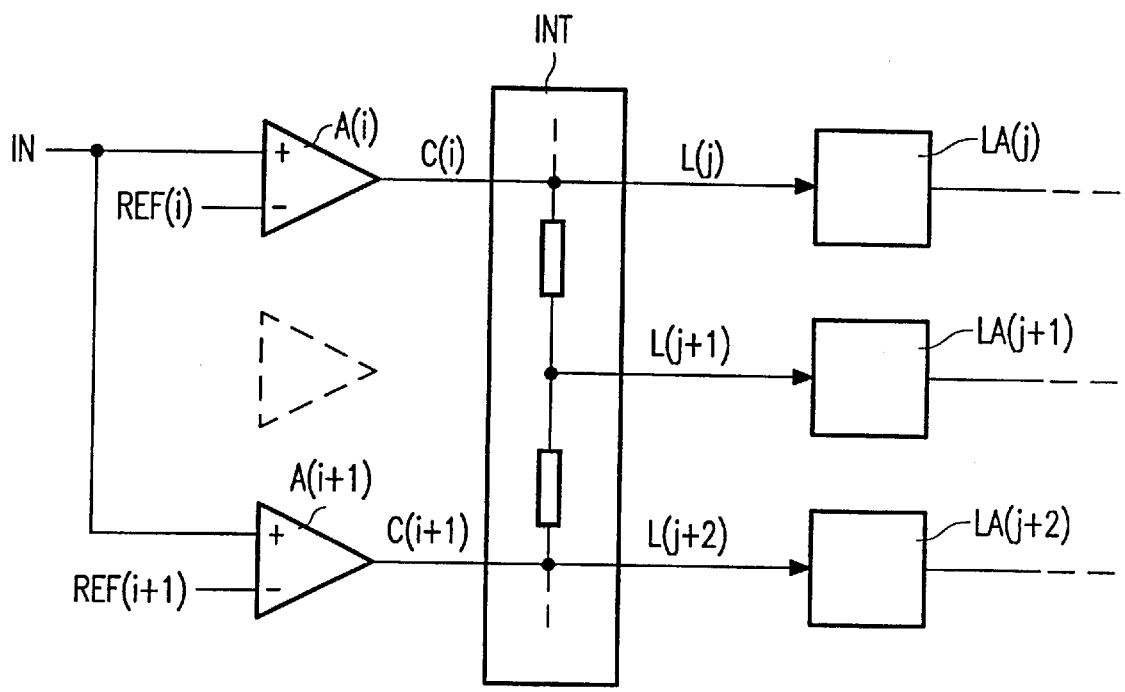
FIG. 7 shows, in a block diagram form, an example of a conversion circuit which may optionally be used to implement the invention to advantage.

Another option to implement the invention to advantage is that the FIG. 1 conversion circuit CONV includes an interpolation circuit which is coupled between an array of input stages, which carry out comparisons, and an array of latches, which provide the digital codes DC. An advantage of this option will be explained with reference to FIG. 7. FIG. 7 shows two input stages A(i) and A(i+1), an interpolation circuit INT and three latches LA(j), LA(j+1) and LA(j+2). The input stages A(i) and A(i+1) compare the input signal IN with the respective reference levels REF(i) and REF(i+1) and, in response, provide respective comparison signals C(i) and C(i+1). The interpolation circuit INT provides, in response to the comparison signals C(i) and C(i+1), three latch input signals L(j), L(j+1) and L(j+2).

If, in FIG. 7, the interpolation circuit INT were not present, three instead of two input stages would be required to provide the three latch input signals L(j), L(j+1) and L(j+2). In that case, an additional reference level in between REF(i) and REF(i+1) would be required. Consequently, the interpolation circuit INT allows reference levels to be further spaced apart. As mentioned hereinbefore, the reference levels, with which the input signal IN is effectively compared, deviate to a certain extent from the nominal reference levels, which is partly due to conversion component non-idealities. This deviation may be that large, that two adjacent effective reference levels have a higher-lower relation which is opposite to that of the corresponding nominal reference levels. In that case, the A/D conversion characteristic will be non-monotonous, which will cause severe distortion. The further the reference levels are spaced apart, the greater the deviation may be before the A/D conversion characteristic becomes non-monotonous. Thus, an interpolation circuit allows relatively relaxed requirements on the conversion components in terms of tolerances, temperature dependency, and the like.

Figure 8:
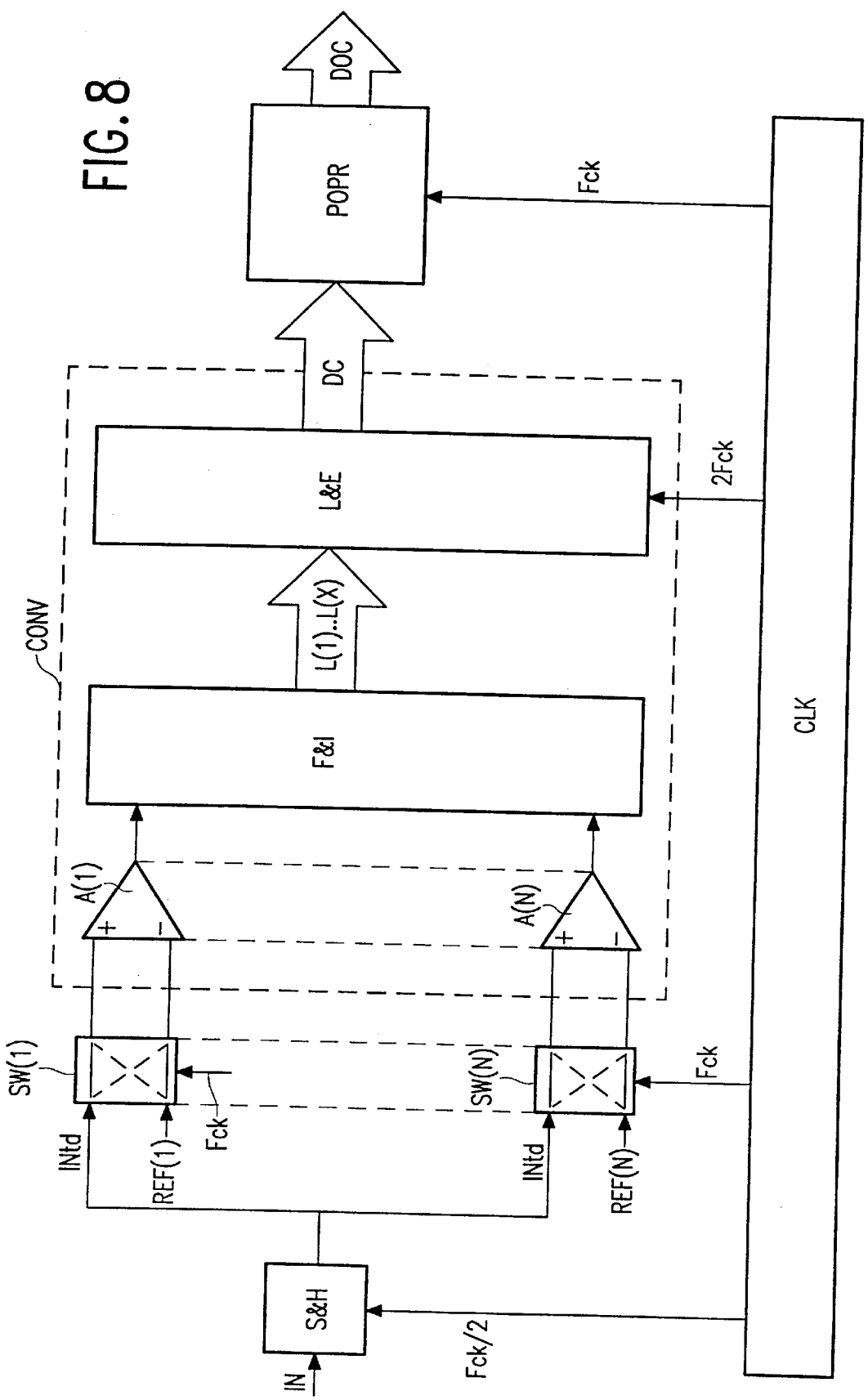
FIG. 8 shows, in a block diagram form, an example of an A/D conversion arrangement in accordance with the invention.

FIG. 8 shows an example of an A/D conversion arrangement in accordance with the invention including the optional features described above. The FIG. 8 A/D conversion arrangement comprises the following main parts: a sample-and-hold circuit S&H, an array of switching circuits SW(1) . . . SW(N), a conversion circuit CONV, a post-processing circuit POPR and a clock circuit CLK. The conversion circuit CONV comprises the following parts: an array of amplifiers A(1) . . . A(N), a folding-and-interpolation circuit F&I and a latch-and-encoding circuit L&E.

In FIG. 8, the sample-and-hold S&H circuit transforms an input signal IN into a time-discrete version INtd thereof. The time-discrete version INtd is applied to the array of amplifiers A(1) . . . A(N) together with respective reference levels REF(1) . . . REF(N) via the switching circuits SW(1) . . . SW(N), respectively. The array of amplifiers A(1) . . . A(N) carries out comparisons between the time-discrete version of the input signal IN and the reference levels REF(1) . . . REF(N), respectively. The results of these comparisons are processed in the folding and interpolation circuit F&I to provide latch input signals L(1) . . . L(X). The latch-and-encoding circuit L&E derives digital codes DC from the latch input signals L(1) . . . L(X) supplied thereto. The post-processing circuit POPR processes the digital codes DC to provide digital output codes DOC. It may be implemented, for example, as shown in FIG. 2b. The clock circuit CLK supplies a clock signal Fck to the array of switching circuits SW(1) . . . SW(N) and to the post-processing circuit POPR. It also supplies clock signals Fck/2 and 2Fck, whose frequencies are, respectively, half and twice that of clock signal Fck, to the sample-and-hold circuit S&H and to the latch-and-encoding circuit L&E, respectively.

It should be noted that international patent applications IB96/00834, IB96/00536 and IB96/00869 describe techniques which may be applied to advantage in the folding and interpolation circuit F&I. These applications are herein incorporated by reference, together with any corresponding applications.

Figure 9:
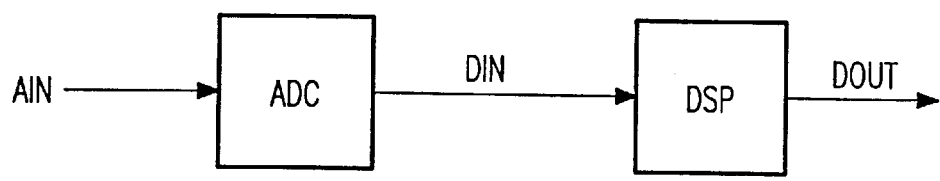
FIG. 9 shows, in a block diagram form, a digital signal processing device in accordance with the invention.

FIG. 9 shows a signal-processing device which comprises a digital signal-processing circuit DSP and an A/D conversion arrangement ADC in accordance with the FIG. 1 basic principles. The A/D conversion arrangement ADC supplies, in response to an analog input signal AIN, a digital signal DIN to the digital signal-processing circuit DSP. The digital signal-processing circuit DSP processes the digital signal DIN to obtain a desired digital output signal DOUT.

The drawings and their description hereinbefore, illustrate rather than limit the invention. Evidently, there are numerous alternatives which fall within the scope of the appended claims. In that respect, the following closing remarks are made.

There are numerous ways of physically spreading functions or functional elements over various units. In this respect, the drawings are very diagrammatic and respectively represent only one possible embodiment of the invention. Furthermore, the invention can be implemented by means of hardware comprising several distinct elements and, at least partially, by means of a suitably programmed computer.

The term sample-and-hold should be construed broadly so as to include, for example, track-and-hold. The sample-and-hold circuit S&H, shown in FIG. 8, may be implemented, for example, as described in U.S. Pat. No. 5,298,801.

Any reference signs between parentheses shall not be construed as limiting the claim concerned.

What is claimed is:

1. An A/D conversion arrangement having a conversion circuit (CONV) for providing digital codes (DC) on the basis of respective comparisons between an input signal (IN) and at least one reference level (REF) provided at input terminals of said conversion circuit, wherein the A/D conversion arrangement comprises:

switching means (SW) for interchanging only the connection of the input signal (IN) and the respective reference level signal (REF) at said input terminals without inverting said signals (IN, REF) in respect of at least one comparison; and post-processing means (POPR) for processing the digital codes (DC) to obtain digital output codes (DOC) whose respective signs and magnitudes are, at least on average, substantially independent of any interchanges.

2. An A/D conversion arrangement as claimed in claim 1, characterized in that it comprises sample-and-hold means (S&H) for applying the input signal (IN) to the conversion circuit (CONV) in a time-discrete manner (INtd).

3. An A/D conversion arrangement as claimed in claim 2, characterized in that the switching means (SW) are coupled to carry out the interchanging at twice the sample rate of the sample-and-hold means (S&H).

4. An A/D conversion arrangement as claimed in claim 1, characterized in that the post-processing means (POPR) are arranged to provide a digital output code (DOC(i)) as a function of the difference ($\Delta$) between a digital code (DC(i)+) before an interchange and a digital code (DC(i)−) after an interchange.

5. An A/D conversion arrangement as claimed in claim 1, characterized in that the switching means (SW) are coupled to carry out the interchanging in a random manner, and in that the post-processing means (POPR) comprises an inverter (INV) for inverting or not inverting the digital codes (DC) in accordance with the interchanging.

6. An A/D conversion arrangement as claimed in claim 1, characterized in that the post-processing means (POPR) comprise:

error derivation means (DEL,ALU) for deriving an error code (c$\epsilon$) from the sum of a digital code (DC(0)+) before an interchange and a digital code (DC(0)−) after an interchange;

storage means (MEM) for storing the error code (c$\epsilon$); and correction means (SUB) for correcting a further digital code (DC(i)) with the error code (c$\epsilon$), to obtain a digital output code (DOC(i)).

7. An A/D conversion arrangement as claimed in claim 1, characterized in that the conversion circuit (CONV) comprises interpolation means (INT) which are coupled between an array of input stages ( . . . A(i),A(i+1) . . . ) for carrying out the comparisons and an array of latches ( . . . L(j),L(j+1),L(j+2) . . . ) for providing the digital codes (DC).

8. A method of A/D conversion comprising the step of obtaining digital codes (DC) on the basis of respective comparisons between an input signal (IN) and at least one reference level (REF), characterized in that the method comprises the steps of:

interchanging (SW) the input signal and the respective reference level prior to the comparison;

processing (POPR) the digital codes (DC) to obtain digital output codes (DOC) whose respective signs and magnitudes are, at least on average, substantially independent of any interchanges.

9. A signal-processing device comprising a digital signal-processing circuit (DSP) and an A/D conversion arrangement (ADC) as claimed in claim 1 for supplying a digital signal (DIN) to said digital signal-processing circuit.

* * * * *